United States Patent [19]
Bertram et al.

[11] Patent Number: 4,934,582
[45] Date of Patent: Jun. 19, 1990

[54] METHOD AND APPARATUS FOR REMOVING SOLDER MOUNTED ELECTRONIC COMPONENTS

[75] Inventors: Michael J. Bertram; Daniel M. Andrews, both of Austin, Tex.

[73] Assignee: Microelectronics and Computer Technology Corporation, Austin, Tex.

[21] Appl. No.: 410,171

[22] Filed: Sep. 20, 1989

[51] Int. Cl.$^5$ ............................................. B23K 1/018
[52] U.S. Cl. .................................. 228/191; 228/264; 228/19
[58] Field of Search ..................... 228/119, 106, 180.2, 228/191, 264, 19

[56] References Cited

U.S. PATENT DOCUMENTS

| | | | |
|---|---|---|---|
| 3,627,191 | 12/1971 | Hood, Jr. | 228/19 |
| 3,751,799 | 8/1973 | Reynolds | 228/191 |
| 3,973,714 | 8/1976 | Lesyk et al. | 228/106 |
| 4,164,606 | 8/1979 | Spirig | 428/605 |
| 4,436,242 | 3/1984 | Shisler et al. | 228/264 |
| 4,614,858 | 9/1986 | Vial | 219/230 |
| 4,746,050 | 5/1988 | Brown | 228/57 |
| 4,813,589 | 3/1989 | Palmer et al. | 228/119 |

FOREIGN PATENT DOCUMENTS

| | | | |
|---|---|---|---|
| 3600208 | 2/1987 | Fed. Rep. of Germany | 228/264 |
| 31573 | 2/1989 | Japan | 228/264 |
| 113171 | 5/1989 | Japan | 228/19 |

OTHER PUBLICATIONS

IBM Technical Disclosure Bulletin, "Solder Wick", vol. 13, No. 2, p. 445, Jul. 1970.
IBM Technical Disclosure Bulletin, Desoldering Unit, vol. 21, No. 11, p. 4482, Apr. 1979.

Primary Examiner—Nicholas P. Godici
Assistant Examiner—Samuel M. Heinrich
Attorney, Agent, or Firm—David M. Sigmond

[57] ABSTRACT

A method and apparatus are described for the removal of solder mounted surface mount electronic components which includes the removal of old solder, broken leads, and the electronic component without damaging other devices on the substrate. A desoldering braid is shaped to cover each of the electronic component's outer lead bonds without contacting the component's base. The desoldering braid is heated and brought in contact with the bonds until the solder flows into the desoldering braid and any broken outer leads attach to the desoldering braid. Upon removal of the desoldering braid the electronic component can be lifted off the surface. The desoldered solder joints will contain a thin uniform coating of solder less than approximately 50 micro inches thick. This allows for removal and replacement of solder mounted electronic components with leads on center lines spaced less than 0.020 inches.

22 Claims, 3 Drawing Sheets

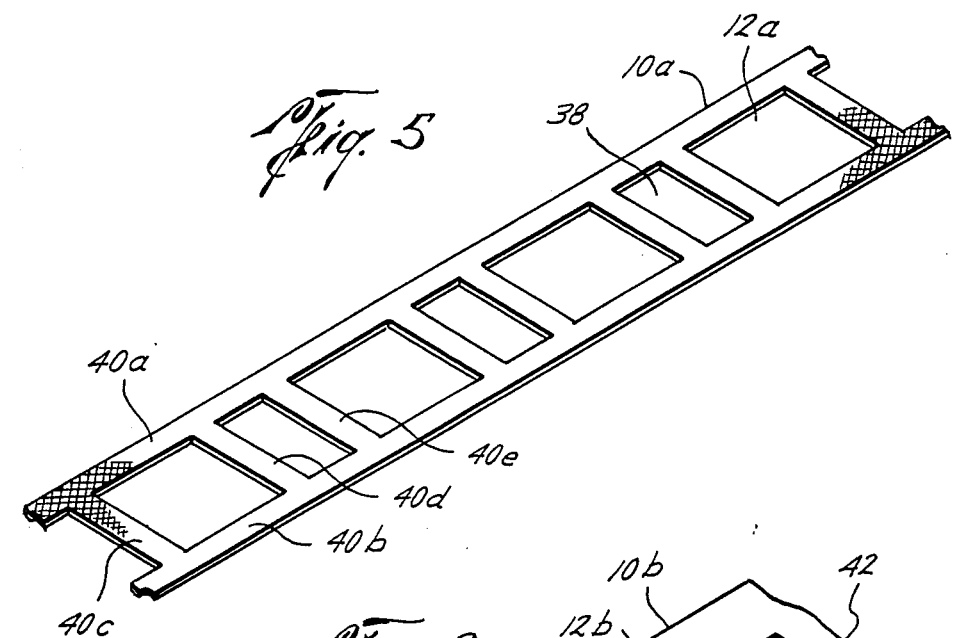
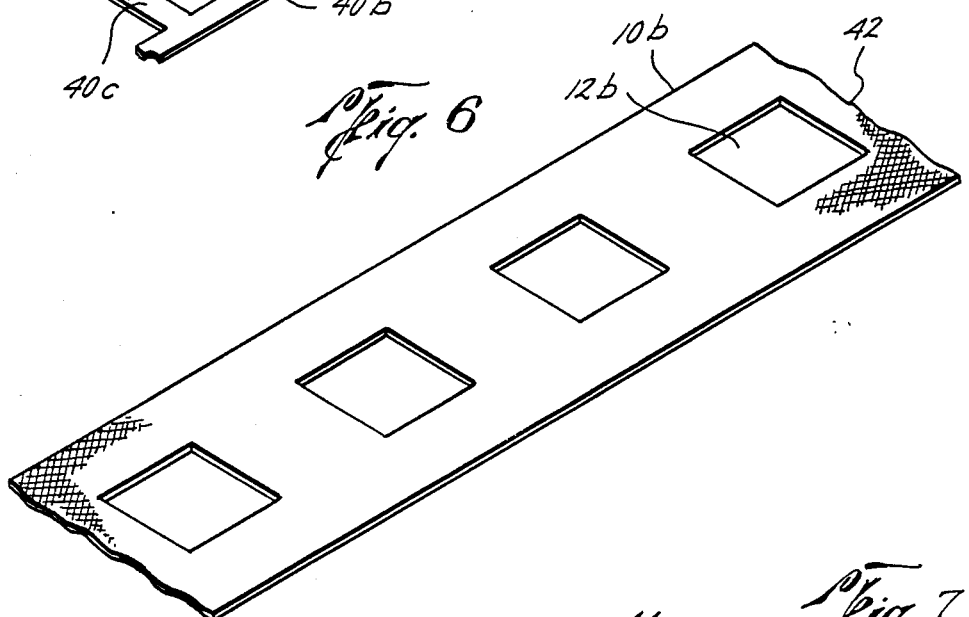
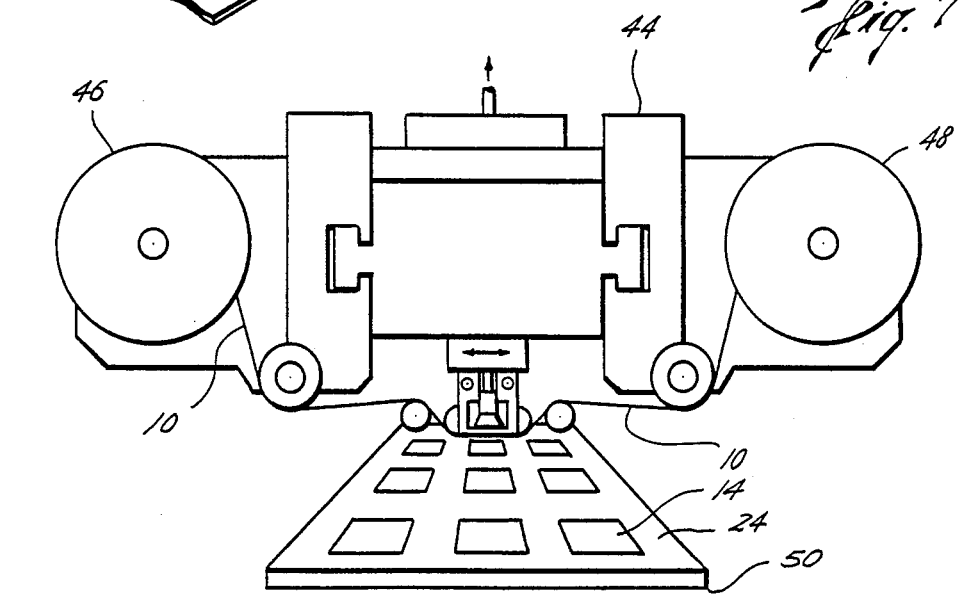

METHOD AND APPARATUS FOR REMOVING SOLDER MOUNTED ELECTRONIC COMPONENTS

BACKGROUND OF THE INVENTION

The present invention relates to the removal of a solder mounted electronic component on a surface. Solder mounted electronic components are typically used in close proximity to other components on the surface, such as a substrate or printed circuit board. When an electronic component fails it often becomes economically necessary to replace the bad device rather than replace the entire substrate. But this removal and replacement operation needs to be done without damaging other components in close proximity to the damaged device.

There are numerous conventional methods for surface repair where the solder is heated and the device removed from the molten solder. For instance, heating by means of a hot gas is described in U.S. Pat. No. 4,813,589 to Palmer et al. where a tube allows hot air to be directed from an external heat source to a component on a circuit board to be removed without permitting heat to flow to adjacent components, as well as protecting the chip from heat by placing a vacuum suction cup on top of the chip. Heating by means of heated blades is described in U.S. Pat. No. 4,614,858 to Vial where a desoldering tool contains heater bars shaped to contact the solder terminations to be desoldered as well as grasp the component to be removed. These conventional techniques have the drawbacks of leaving the reworked site on the substrate with uneven amounts of solder, leaving varying amounts of brittle intermetallic compounds and oxides that can lead to poor soldering joints of the replacement devices, and other reliablility problems. Further, the adverse effects of uneven solder thickness and intermetallic compounds become acute when the device lead center lines are less than about 0.020 inches, since at these dimensions the total volume of solder is small and the effect of thickness variations and intermetallic particles is great. Additionally, with conventional repair methods the leads that are broken and not attached to electronic components will often remain on the substrate after the electronic components are desoldered and removed. It may then be necessary to attempt to remove the broken leads manually with tweezers and a soldering iron. This manual removal is time consuming and can also result in damage to the substrate or nearby components.

There exists a need for removing a solder mounted electronic component and any broken leads from a multicomponent module in a single step while leaving a minimal amount of solder and intermetallic particles on the module surface, particularly for components with outer lead bonds having center lines spaced less than 0.020 inches.

SUMMARY

The present invention provides a method and apparatus for removal of defective electronic components from substrates wherein the defective device, the old solder, and any broken leads can all be removed at the same time. A desoldering braid contains an opening window shaped so that the base of the electronic component fits inside while the braid makes contact with the solder joints bonding the component's outer leads to the substrate. The desoldering braid is heated to at least the melting point of the solder and contacted to the solder joints in heat exchange relationship until the molten solder flows into the braid, and then the desoldering braid is removed from the solder joints.

A further object of the present invention is wherein a replacement electronic component can be soldered into a substrate under conditions similar to those used in the original manufacture of the substrate.

Yet a further object of the present invention is wherein after removal of the defective electronic component the site on the substrate has a minimal amount of remaining solder.

A still further object of the present invention is wherein the defective electronic component can be removed by either vacuum or mechanical means.

Another object of the present invention is wherein a reliable replacement method exists for outer leads having center lines spaced less than about 0.020 inches.

A further object of the present invention is wherein a desoldering braid is used which contains a woven copper material coated or impregnated with flux.

A still further object of the present invention is to provide a method for desoldering the outer leads of a tape-automated-bonded package from a high density interconnect substrate.

Yet a further object of the present invention is wherein the desoldering braid can be a single window piece or a strip with multiple windows fed in reel to reel form.

Other and further objects, features, and advantages will be apparent from the following description of the presently preferred embodiments of the invention, given for the purpose of disclosure, and taken in Conjuction with the accompanying drawings.

BRIEF DESCRIPTION OF THE DRAWINGS

FIG. 5 is a perspective view illustrating a strip of desoldering braid with multiple windows formed by bonding together pieces of desoldering braid, FIG. 6 is a perspective view illustrating a strip of desoldering braid with multiple windows formed by punching holes in a desoldering braid, and FIG. 7 is a schematic view illustrating the use of the present invention in an automated desoldering system.

DESCRIPTION OF THE PREFERRED EMBODIMENT

Figure 1:
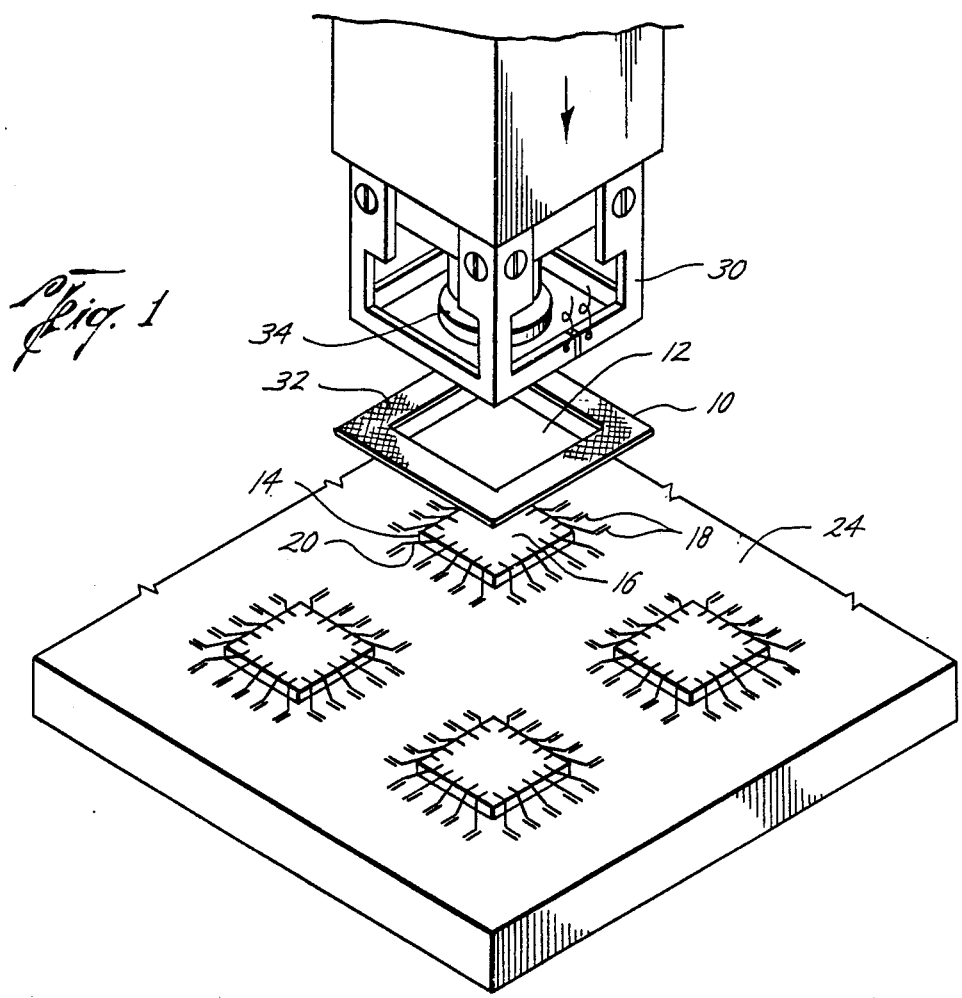
FIG. 1 is a perspective view of the present invention illustrating the step of aligning an electronic component, a desoldering braid, and a heat source.

Referring now to the drawings and particularly FIG. 1, a desoldering braid 10 is used that is capable of absorbing molten solder. Desoldering braid 10 preferably contains a woven copper material coated or impregnated with flux, such as sold under the trademark "SOLDER WICK", although other suitable materials capable of absorbing molten solder are well known to those skilled in the art. The desoldering braid 10 contains a window 12 that is shaped so that the base 16 of an electronic component 14 will fit inside the window 12 while the desoldering braid 10 covers each of the solder joints 18 that connect the outer leads 20 of electronic component 14 to a surface 24 that electronic component 14 us solder mounted upon. For the purposes of illustration, a tape-automated-bonded (TAB) component 14 is shown with outer leads 20 attached to a high density interconnect substrate 24 by way of solder points 18. The desoldering braid 10 is positioned so that it can be brought in contact with each of the solder joints 18 while the base 16 of electronic component 14 fits inside the window 12 of desoldering braid 10.

Figure 2:
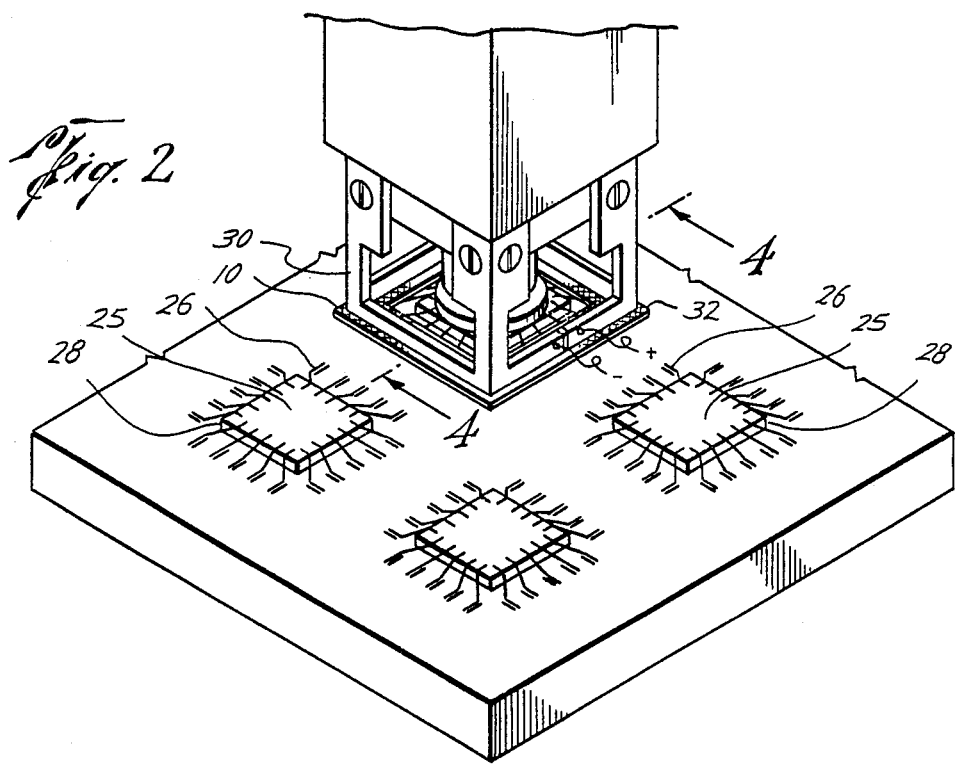
FIG. 2 is a perspective view similar to FIG. 1 illustrating the step of applying heat to the desoldering braid from a heat source and contacting the desoldering braid with the solder joints between an electronic component and a mounting surface.

Referring now to FIG. 2, desoldering braid 10 is brought in contact with each of the solder joints 18, preferably simultaneously, while avoiding contact or interference with other heat sensitive areas on surface 24, such as base 25 and solder joints 26 of components 28 in close proximity to electronic component 14. Desoldering braid 10 must be heated to a temperature sufficient to melt the solder, that is, at least as hot as the melting point of the solder. This can be accomplished, for example, by contacting the desoldering braid 10 with a heat source 30, such as a blade thermode. The heat from heat source 30 causes the solder in solder joints 18 to melt and flow from solder joints 18 into desoldering braid 10. In the preferred embodiment, heat source 30 will also provide sufficient heat exchange contact pressure between desoldering braid 10 and solder joints 18 by pressing down on side 32 of desoldering braid 10 opposite the solder joints 18. Further, the heat source 20 will preferably have a shape similar to the interface between the desoldering braid 10 and the solder joints 18 so that the desoldering braid 10 is sandwiched between the solder joints 18 and the heat source 30.

Figure 3:
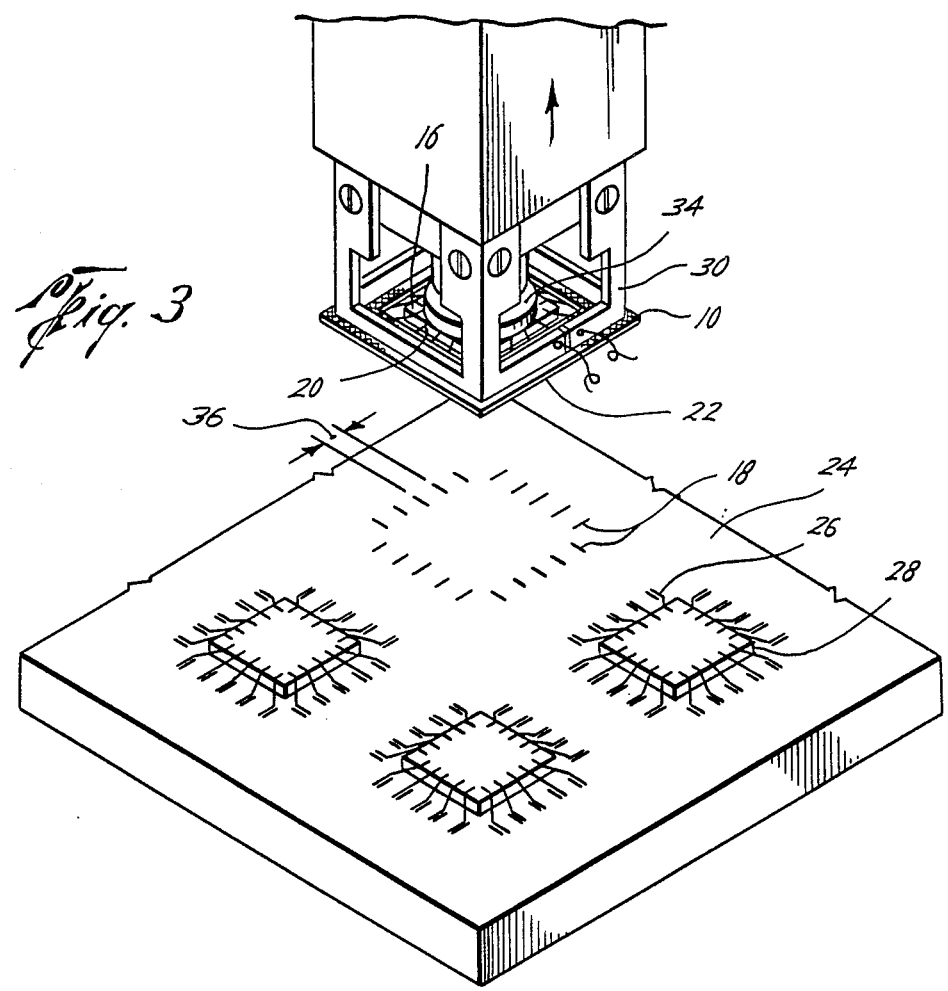
FIG. 3 is a perspective view similar to FIG. 1 illustrating the step of removing a desoldered electronic component from a mounting surface.

Referring now to FIG. 3, once the solder from the solder joints 18 has flowed into desoldering braid 10 the desoldering braid 10 is removed from solder joints 18. Loose or detached outer leads 22 will also adhere to desoldering braid 10 due to surface tension, and thereby be removed from surface 24 as desoldering braid 10 is removed. The electronic component 14 can then be lifted off surface 24, either simultaneously or subsequent to the removal of the solder-filled desoldering braid 10. Preferably electronic component 14 is lifted from surface 24 simultaneously with the retraction of heat source 30 and desoldering braid 10. Various methods of lifting electronic component 14 off surface 24 are well known to those of skill in the art. For the purpose of illustration, electronic component 14 can be removed by contacting base 16 with vacuum pipette 34 positioned centrally inside both desoldering braid 10 and blade thermode 30. As blade thermode 30 retracts, electronic component 14 is lifted off surface 24 by vacuum pipette 34. Desoldering braid 10 can be lifted off surface 24 by outer leads 20 connected to electronic component 14 and beneath desoldering braid 10.

After electronic component 14 is removed from surface 24, there will exist traces of solder from solder joints 18 on surface 24. Applicant has found, however, that the thin, uniform coating of solder that remains is less than 50 micro inches thick. The removal of detached leads, intermetallic particles, and all but a thin uniform coating of solder will minimize the risk of inadvertant short circuits on surface 24. Further, a new replacement part (not shown) with fresh solder can be solder attached in place under conditions similar to those used in the original surface mount soldering process. This will facilitate a replacement operation when electronic component 14 is removed as defective.

Figure 4:
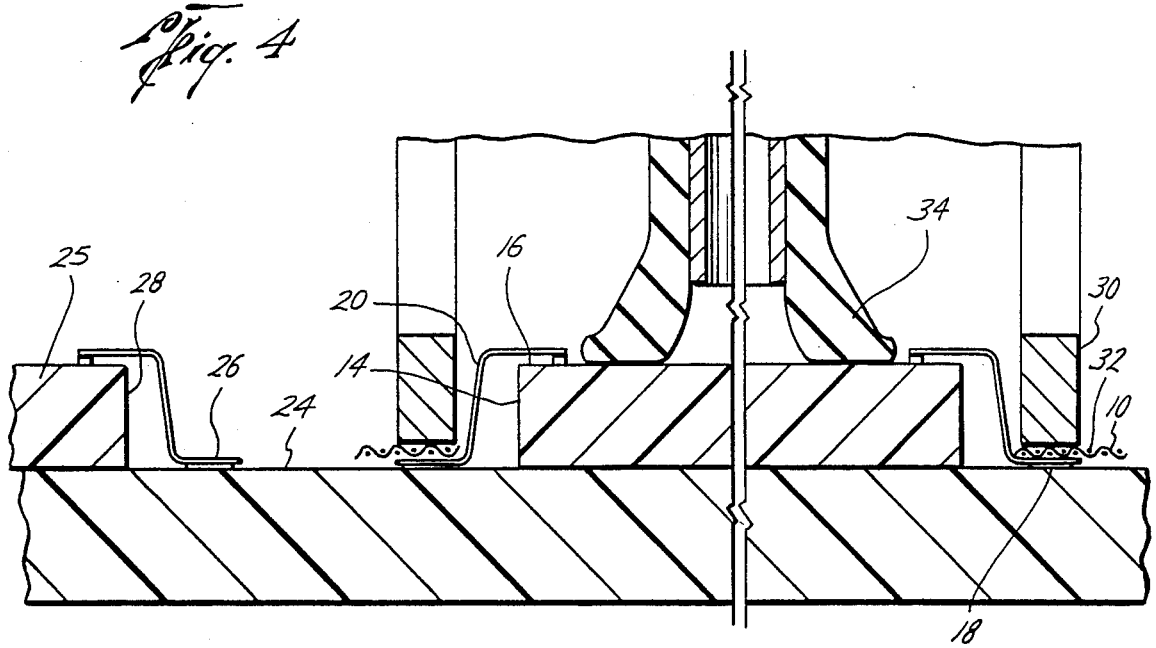
FIG. 4 is an exploded cross-sectional view taken along line 4—4 for FIG. 2 illustrating a desoldering braid in contact with the solder joints between an electronic component and a mounting surface.

Referring now to FIG. 4, a cross-sectional view taken along line 4—4 of FIG. 2 further illustrates the present invention. Desoldering braid 10 contacts each solder joint 18 connecting outer leads 20 of electronic component 14 to surface 24 while avoiding contact with bases 25 and solder joints 26 of components 28 in close proximity. Heat source 30 heats desoldering braid 10 to at least the melting point of the solder. Heat source 30 also contacts desoldering braid 10 on side 32 opposite solder joints 18 with a pressure so that the solder from solder joints 18 will flow into desoldering braid 10 and any broken outer leads and intermetallic particles will adhere to desoldering braid 10. Likewise, vacuum pipette 34 contacts base 16 so that electronic component 14 can be lifted off surface 24 as soon as desoldering is completed.

By way of example, a tape-automated-bonded electronic component having outer lead center lines spaced 0.012 inches apart was desoldered from a high density interconnect substrate. The dimensions of component's base were 0.327×0.327 inches, and the lead lengths were 0.131 inches, of which 0.020 inches extended lengthwise from the base bottom and was solder bonded to the substrate. A woven copper desoldering braid was coated with flux to prevent the copper from oxidizing and becoming less attractive of molten solder. The desoldering braid contained a window size of 0.460×0.460 inches, and exterior perimeter of 0.600×0.600 inches, and thus a length of 0.140 inches from the window edge to the exterior for covering the solder joints. The desoldering braid was 0.011 inches thick. The desoldering braid was positioned symetrically above the solder joints and around the component's base. The blade thermode was heated to 300 degrees C. in order to uniformly heat the desoldering braid and melt solder with a melting point of 180 degrees C. The blade thermode contacted the desoldering braid so that a pressure of 6 grams per solder joint was applied, totaling 1,032 grams. The solder flowed from the solder joints into the desoldering braid in about 7 seconds. Thereafter the component was removed and the remaining solder on the desoldered solder joints formed a uniform coating of less than 50 micro inches thick. Applicant has also applied this method on devices having outer lead center lines spaced as close as 0.004 inches.

Referring now to FIG. 5, a desoldering braid strip 10a is seen with a plurality of windows 12a shaped to surround an electronic component and contact its solder joints, as well as a plurality of windows 38 shaped to provide spacing between adjacent windows 12a. Windows 38 ensure that when the desoldering braid is used it will not contact other solder joints 26 or components 28 near the component 14 to be desoldered. Preferably no more desoldering braid 10a is present then is necessary to draw solder from each of the solder joints 18. Desoldering braid strip 10a is formed by bonding together various separate pieces of desoldering material, such as 40a, 40b, 40c, 40d, and 40e, until the desired desoldering braid strip structure is obtained.

Referring now to FIG. 6, another embodiment of a desoldering braid strip is seen. Desoldering braid strip 10b is formed by taking a single thick piece of desoldering braid 42, and then punching holes where windows 12b are desired. This embodiment may be preferred, for instance, where there do not exist heat sensitive areas near solder joints 18 since desoldering braid 10b is likely to be easier to fabricate then desoldering braid 10a.

Referring now to FIG. 7, an automated desoldering system 44 is shown. The present invention can be automated by a variety of systems known to those having skill in the art, including many of the same systems that were used to do the original soldering of component 14 to surface 24. One such system is a Farco 120 blade thermode bonding system. A strip of desoldering braid 10 is fed from reel-out means 46 to reel-in means 48 so that a fresh non-solder filled section of desoldering braid 10 can surround each electronic component 14 to be desoldered. The electronic components 14 are positioned for desoldering by an adjustable base 50 and then desoldered as previously described. After desoldering, the desoldering braid 10 is advanced to the next window 12 so that another electronic component 14 can be positioned for desoldering and removal.

The present invention, therefore, is well adapted to carry out the objects and attain the ends and advantages mentioned as well as others inherent therein. While a presently preferred embodiment of the invention has been given for the purpose of disclosure, numerous changes in the details of construction, arrangement of parts, and steps of the process will be readily apparent to those skilled in the art and which are encompassed in the spirit of the invention and the scope of the appended claims.

What is claimed is:

1. A method for desoldering a solder mounted electronic component from a surface comprising:
   positioning a desoldering braid above the electronic component, wherein the desoldering braid contains an opening shaped so that the base of the electronic component fits inside the opening while the desoldering braid covers each of the solder joints that connect the outer leads of the electronic component to the surface,
   heating the desoldering braid to at least the melting point of the solder,
   contacting the desoldering braid with each of the solder joints in heat exchange relationship so that the solder is rendered molten and flows from the solder joints into the desoldering braid, and
   removing the solder-filled desoldering braid from the solder joints after the solder has flowed from the solder joints into the desoldering braid.

2. The method of claim 1 wherein the desoldering braid is a piece of woven copper material.

3. The method of claim 2 wherein the woven copper material contains flux.

4. The method of claim 1 wherein the solder joints are simultaneously desoldered.

5. The method of claim 1 wherein the electronic component has outer leads tape-automated-bonded by soldering to a high density interconnect substrate.

6. The method of claim 5 wherein the outer leads have center lines spaced less than approximately 0.020 inches.

7. The method of claim 1 wherein a heat source for the desoldering braid also provides pressure at the interface between the desoldering braid and the solder joints by contacting the desoldering braid on the side opposite the solder joints 8. The method of claim 7 wherein the shape of the heat source is similar to the interface between the desoldering braid and the solder joints.

9. The method of claim 1 wherein the desoldering braid fails to contact solder joints of other components on the surface.

10. The method of claim 1 wherein upon removal of the desoldering braid any outer leads that were connected to the solder joints and detached from the electronic component become fastened to the desoldering braid and are also removed from the solder joints.

11. The method of claim 1 further comprising removing the desoldered electronic component from the surface.

12. The method of claim 11 wherein after removing the desoldered component the solder joints are left with a thin and nearly uniform coating of solder.

13. The method of claim 12 wherein the thin and nearly uniform coating of solder is less than about 50 micro inches thick.

14. The method of claim 1 wherein the desoldering braid is a strip and is fed through in reel to reel form.

15. An apparatus for desoldering a solder mounted electronic component from a surface comprising:
   a desoldering braid positioned above the electronic component, wherein the desoldering braid contains an opening shaped so that the base of the electronic component fits inside the opening while the desoldering braid covers each of the solder joints that connect the outer leads of the electronic component to the surface,
   means for heating the desoldering braid to at least the melting point of the solder,
   means for contacting the desoldering braid with each of the solder joints in heat exchange relationship so that the solder is rendered molten and will flow from the solder joints into the desoldering braid, and
   means for removing the solder-filled desoldering braid from the solder joints after the solder has flowed from the solder joints into the desoldering braid.

16. The apparatus of claim 15 wherein the desoldering braid is a piece of woven copper material.

17. The apparatus of claim 15 wherein the solder joints are simultaneously desoldered.

18. The apparatus of claim 15 wherein the means for heating the desoldering braid is a thermode that provides pressure at the interface between the desoldering braid and the solder joints by contacting the desoldering braid on the side opposite the solder joints.

19. The apparatus of claim 18 wherein the shape of the thermode is similar to the shape of the interface between the solder joints and the desoldering braid.

20. The apparatus of claim 15 further comprising means for removing the desoldered electronic component from the surface.

21. The apparatus of claim 20 wherein the means for removing the desoldered electronic component is a vacuum pipette brought in contact with the top of the base of the electronic component.

22. The apparatus of claim 15 wherein the desoldering braid is a strip and is fed through in reel to reel form.

* * * * *

UNITED STATES PATENT AND TRADEMARK OFFICE
CERTIFICATE OF CORRECTION

PATENT NO. : 4,934,582

DATED : 06/19/90

INVENTOR(S) : BERTRAM ET AL

It is certified that error appears in the above—identified patent and that said Letters Patent is hereby corrected as shown below:

Column 2, line 23, delete indentation before "to provide".

Column 3, line 9, change "us" to -- is --.

Column 3, line 13, change "points" to -- joints --.

Signed and Sealed this

Thirty-first Day of March, 1992

Attest:

HARRY F. MANBECK, JR.

Attesting Officer

Commissioner of Patents and Trademarks